(12) United States Patent
Pan et al.

(10) Patent No.: US 11,322,542 B2
(45) Date of Patent: May 3, 2022

(54) LIGHT-EMITTING DIODE (LED) ASSEMBLY AND METHOD OF MANUFACTURING AN LED CELL OF THE SAME

(71) Applicant: HARVATEK CORPORATION, Hsinchu (TW)

(72) Inventors: Shyi-Ming Pan, Hsinchu (TW); Mam-Tsung Wang, Hsinchu (TW); Ping-Lung Wang, Hsinchu (TW)

(73) Assignee: HARVATEK CORPORATION, Hsinchu (TW)

( * ) Notice: Subject to any disclaimer, the term of this patent is extended or adjusted under 35 U.S.C. 154(b) by 152 days.

(21) Appl. No.: 16/831,840

(22) Filed: Mar. 27, 2020

(65) Prior Publication Data
US 2021/0305313 A1 Sep. 30, 2021

(51) Int. Cl.
*H01L 27/15* (2006.01)
*H01L 29/417* (2006.01)
*H01L 33/44* (2010.01)

(52) U.S. Cl.
CPC ...... *H01L 27/156* (2013.01); *H01L 29/41725* (2013.01); *H01L 33/44* (2013.01)

(58) Field of Classification Search
CPC .............. H01L 31/173; H01L 31/1856; H01L 31/03044; H01L 31/1852; H01L 31/02327; H01L 31/02019; H01L 33/32; H01L 33/60; H01L 33/007; H01L 29/16; H01L 29/78; H01L 2933/0058
See application file for complete search history.

(56) References Cited

U.S. PATENT DOCUMENTS

| | | | | |
|---|---|---|---|---|
| 5,753,928 | A * | 5/1998 | Krause | H01L 31/173 250/551 |
| 2008/0083938 | A1* | 4/2008 | Liang | H01L 27/14609 257/292 |
| 2012/0086044 | A1 | 4/2012 | Hata et al. | |
| 2013/0299841 | A1* | 11/2013 | Ranglack | H01L 31/03044 257/76 |
| 2014/0191249 | A1 | 7/2014 | Blanchard et al. | |
| 2016/0308085 | A1* | 10/2016 | Guter | H01L 33/20 |
| 2019/0114970 | A1* | 4/2019 | Moradi | G09G 3/3266 |
| 2019/0148593 | A1* | 5/2019 | Islam | H01L 33/007 257/13 |
| 2020/0035843 | A1* | 1/2020 | Zhao | H01L 31/035236 |
| 2020/0066786 | A1* | 2/2020 | Hartensveld | H01L 29/66522 |
| 2020/0066849 | A1 | 2/2020 | Then et al. | |

(Continued)

FOREIGN PATENT DOCUMENTS

TW 201010072 A1 3/2010
TW 201336048 A1 9/2013

*Primary Examiner* — Sitaramarao S Yechuri
(74) *Attorney, Agent, or Firm* — ScienBiziP, P.C.

(57) ABSTRACT

A light-emitting diode (LED) assembly comprises a plurality of LED cells and a driving circuit. Each of the LED cells includes an LED and a transistor. The LED includes first and second LED layers and an LED electrode. The first LED layer includes a III-V compound semiconductor. The second LED layer is over the first LED layer. The LED electrode is over the second LED layer. The first LED layer is free of an LED electrode. The transistor includes a drain region connected to the first LED layer. The driving circuit is configured to drive the LED cells.

14 Claims, 15 Drawing Sheets

(56) References Cited

U.S. PATENT DOCUMENTS

2020/0203421 A1\* 6/2020 Zeisel ................. H01L 29/2003
2020/0273397 A1\* 8/2020 Jeong .................... H01L 25/167
2021/0143299 A1\* 5/2021 Cho ...................... H01L 27/156

\* cited by examiner

US 11,322,542 B2

LIGHT-EMITTING DIODE (LED) ASSEMBLY AND METHOD OF MANUFACTURING AN LED CELL OF THE SAME

BACKGROUND

A light-emitting diode (LED) assembly includes a plurality of LED cells and a driving circuit. Each of the LED cells includes an LED and a transistor. The LED includes a p-type semiconductor layer, a p-type LED electrode (or an anode terminal) connected to the p-type semiconductor layer, an n-type semiconductor layer, and an n-type LED electrode (or a cathode terminal) connected to the n-type semiconductor layer. The driving circuit is configured to drive the LED cells, e.g., to control the on-off state and the brightness of the LED.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
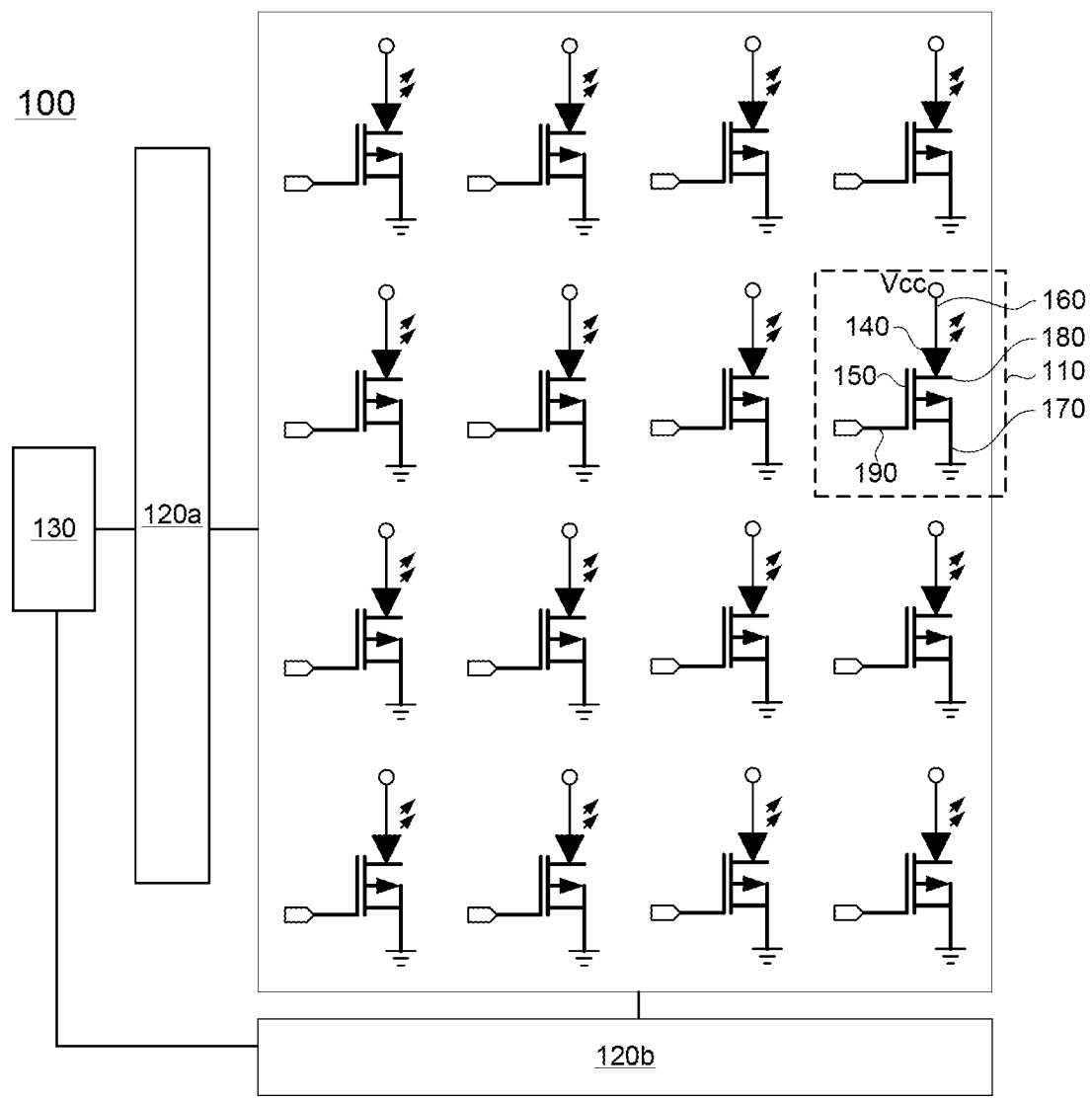
FIG. 1 is a schematic diagram illustrating an exemplary light-emitting diode (LED) assembly according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Systems and methods as described herein comprises a light-emitting diode (LED) assembly, e.g., LED assembly 100 in FIG. 1, that includes an LED cell, e.g., LED cell 110. The LED cell 110 includes an LED, e.g., LED 140, and a transistor, e.g., transistor 150. In an embodiment, the transistor 150 includes a drain region (e.g., drain region 180 in FIG. 1, drain region 1920 in FIG. 22, and drain region 2520 in FIG. 28), that serves as a cathode terminal or an n-type LED electrode of the LED 140. Thus, in such an embodiment, the LED 140 is free of a cathode terminal or an n-type LED electrode. FIG. 1 is a schematic diagram illustrating an exemplary LED assembly 100 in accordance with some embodiments of the present disclosure.

In further detail, the example of FIG. 1 comprises a plurality of LED cells, e.g., LED cell 110, a row decoder 120a, a column decoder 120b, and a driving circuit 130. As shown in FIG. 1, the LED cells are arranged in array of rows and columns. Since the LED cells are similar in structure and operation, only the LED cell 110 will be described hereinbelow. The LED cell 110 includes an LED 140 and a transistor 150. The LED 140 includes an anode terminal 160 or a p-type LED electrode configured to receive a supply voltage (Vcc). The transistor 150 includes a source region 170 configured to receive a reference voltage, e.g., 0V, less than the supply voltage (Vcc). In an embodiment, the transistor 150 further includes a drain region 180 that serves as a cathode terminal or an n-type LED electrode of the LED 140. Thus, in such an embodiment, the LED 140 is free of a cathode terminal or an n-type LED electrode.

The row and column decoders 120a, 120b are connected to the LED cells and are configured to select one of the LED cells, e.g., LED cell 110. The driving circuit 130 is connected to the row and column decoders 120a, 120b and is configured to drive, i.e., control the on/off state and the brightness of the LED 140 of, the LED cell 110 selected by the row and column decoders 120a, 120b.

In an exemplary operation of the LED assembly 100, at an initial state, a gate voltage (Vg), e.g., 0V, is applied to a gate terminal 190 of the transistor 150. This turns the transistor 150 off, disconnecting the drain region 180 of the transistor 150 from, e.g., the ground. As a result, the LED 140 is turned off. When it is desired to turn on the LED 140, a gate voltage (Vg), e.g., substantially equal to the supply voltage (Vcc) at the anode terminal 160 or the p-type LED electrode of the LED 140, is applied to the gate terminal 190 of the transistor 150. This turns the transistor 150 on, connecting the drain region 180 of the transistor 150 to the ground. As a result, the LED 140 is turned on, whereby the LED 140 emits light.

Figure 2:
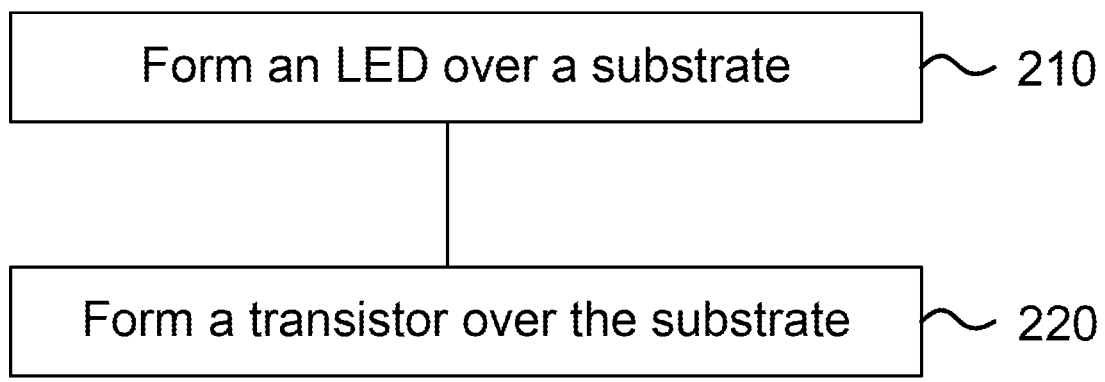
FIG. 2 is a flowchart illustrating an exemplary method of manufacturing an LED cell of the LED assembly according to some embodiments of the present disclosure.

FIG. 2 is a flowchart illustrating an exemplary method 200 of manufacturing an LED cell, e.g., LED cell 110 in FIG. 1, of an LED assembly, e.g., LED assembly 100, according to some embodiments of the present disclosure. The method 200 begins with block 210 in which an LED, e.g., LED 140, of the LED cell 110 is formed over a substrate. The method 200 continues with block 220 in which a transistor, e.g., transistor 150, of the LED cell 110 is formed over the substrate. As will be described below, in an embodiment, the transistor 150 includes a drain region (e.g., drain region 1920 in FIG. 22 and drain region 2520 in FIG. 28) that serves as a cathode terminal or an n-type LED electrode of the LED 140. Thus, in such an embodiment, the LED 140 is free of a cathode terminal or an n-type LED electrode.

FIGS. 3-28 are schematic sectional views illustrating various stages of the manufacturing of an LED cell, e.g., LED cell 110 in FIG. 1, of an LED assembly, e.g., LED assembly 100, according to some embodiments of the present disclosure.

Figure 3:
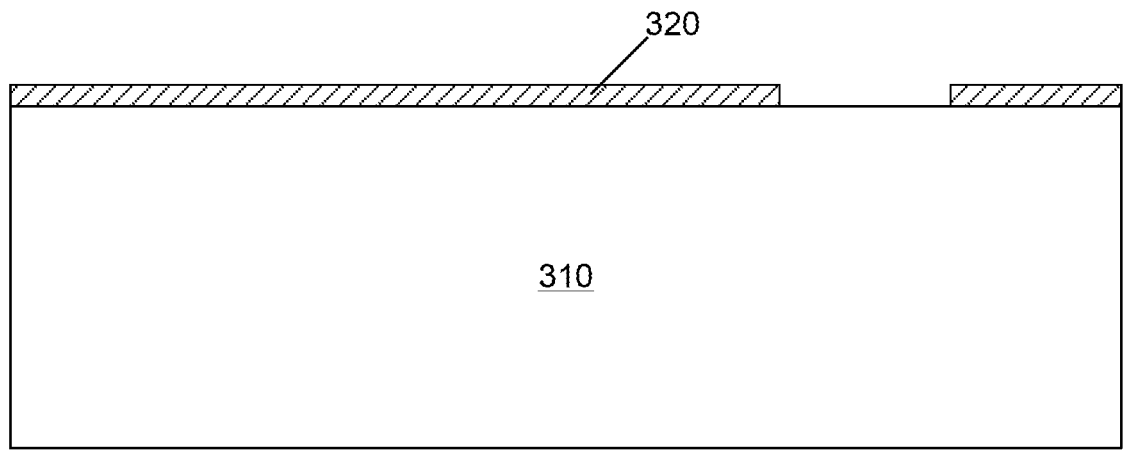
FIGS. 3-28 are schematic sectional views illustrating various stages in the manufacturing of the LED cell according to some embodiments of the present disclosure.

FIG. 3 is a schematic sectional view of a stage in the manufacturing of the LED cell 110 according to some embodiments of the present disclosure. FIG. 3 illustrates a structure after a substrate 310 that includes a patterned dielectric layer 320 on a top surface thereof is provided. The substrate 310 may be a semiconductor substrate, such as a bulk semiconductor substrate, a semiconductor-on-insulator (SOI) substrate, a multi-layered or gradient substrate, or the like. The substrate 310 may be doped or undoped and include a semiconductor material, such as an elemental semiconductor including Si, Ge, a compound or alloy semiconductor including SiGe, SiC, GaAs, GaP, GaAsP, AlInAs, AlGaAs, GaInAs, InAs, GaInP, InP, InSb, GaInAsP, and the like. In this exemplary embodiment, the substrate 310 is a bulk silicon substrate and the top surface of the substrate 310 has a (100) facet.

In some embodiments, the substrate 310 is formed with a well region therein. The formation of the well region in the substrate 310 may include: depositing a mask layer over the substrate 310; patterning the mask layer to expose a portion of the substrate 310; implanting impurities in the portion of the substrate 310 exposed by the mask layer; and removing the mask layer, such as by a wet or dry etching process or a combination thereof.

The dielectric layer 320 may be formed by oxidizing the top surface of the substrate 310, such as by a thermal oxidation, chemical oxidation, any suitable oxidation process, or a combination thereof. In an alternative embodiment, the dielectric layer 320 is formed by depositing a dielectric material on the top surface of the substrate 310, such as by a chemical vapor deposition (CVD), a plasma vapor deposition (PVD), an atomic layer deposition (ALD), variations thereof, any suitable deposition technique, or a combination thereof. Examples of materials for the dielectric layer 320 include, but are not limited to, $SiO_2$, SiN, SiON, SiCN, and SiOCN. The dielectric layer 320 may have a thickness of less than about 100 nm. The dielectric layer 320 may be patterned using, e.g., an electron beam lithography.

Figure 4:
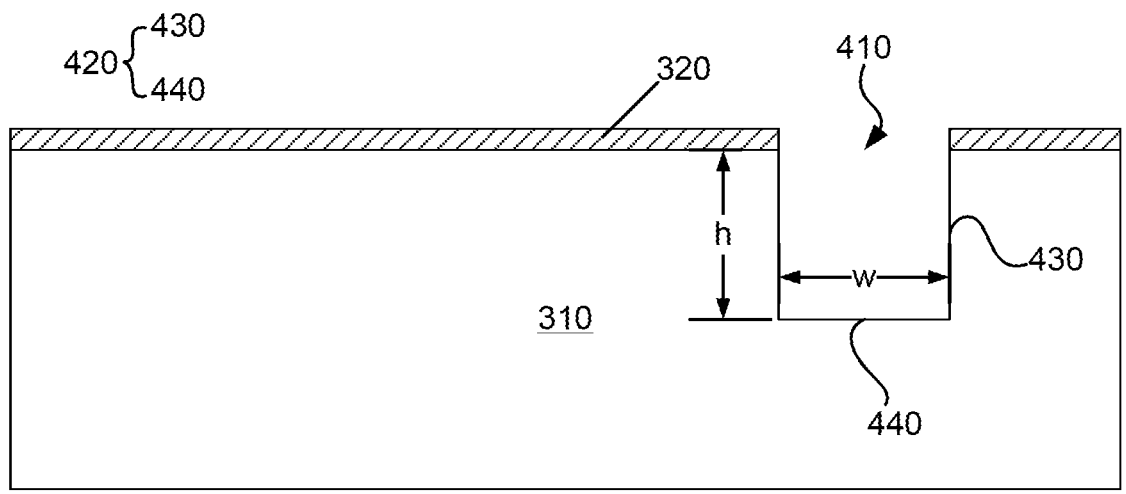

FIG. 4 is a schematic sectional view of another stage in the manufacturing of the LED cell 110 according to some embodiments of the present disclosure. FIG. 4 illustrates a structure after a hole 410 is formed in the substrate 310. The hole 410 is formed by a wet or dry etching process, e.g., a reactive-ion etching (RIE) process, a neutral beam etching (NBE) process, and the like or a combination thereof, using the dielectric layer 320 as a mask.

As shown in FIG. 4, the hole 410 has a substantially rectangular cross-section and is defined by a hole-defining wall 420 that includes a wall surface 430 and a bottom surface 440. The wall surface 430 extends upwardly from a periphery of the bottom surface 440 and is substantially perpendicular to the top surface of the substrate 310. In an exemplary embodiment, the hole 410 has a depth, i.e., the wall surface 430 of the hole-defining wall 420 has a height (h), of about 100 nm to about 700 nm, e.g., about 500 nm. In such an exemplary embodiment, the bottom surface 440 of the hole-defining wall 420 has a width (w) of about 100 nm to about 700 nm, e.g., 500 nm.

Figure 5:
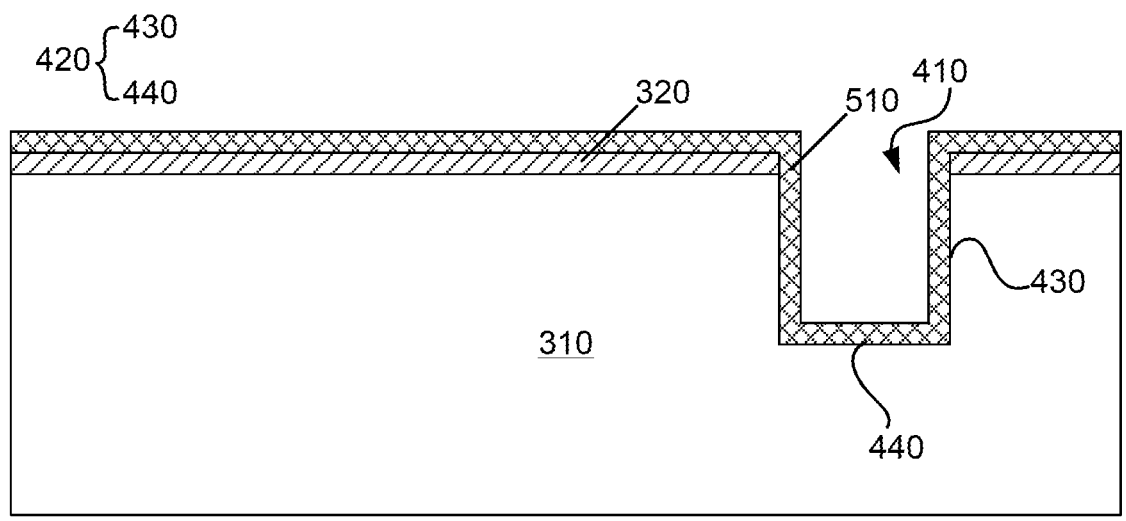

FIG. 5 is a schematic sectional view of another stage in the manufacturing of the LED cell 110 according to some embodiments of the present disclosure. FIG. 5 illustrates a structure after a blocking layer 510 is formed on the top surface of the substrate 310 and the wall surface 430 and the bottom surface 440 of the hole-defining wall 420. The blocking layer 510 may be formed using CVD, PVD, ALD, their variations, e.g., plasma enhanced CVD (PECVD), high density plasma CVD (HDP-CVD), flowable CVD (FCVD), any suitable deposition technique, or a combination thereof. The blocking layer 510 may include a nitride-based material, such as SiN, SiCN, SiON, SiOCN, and the like, or an oxide-based material, such as $SiO_2$. In some embodiments, the blocking layer 510 has a thickness of about 100 nm to about 300, e.g., 200 nm. In other embodiments, the blocking layer 510 has a thickness of about 150 nm to about 250 nm, e.g., 200 nm.

Figure 6:
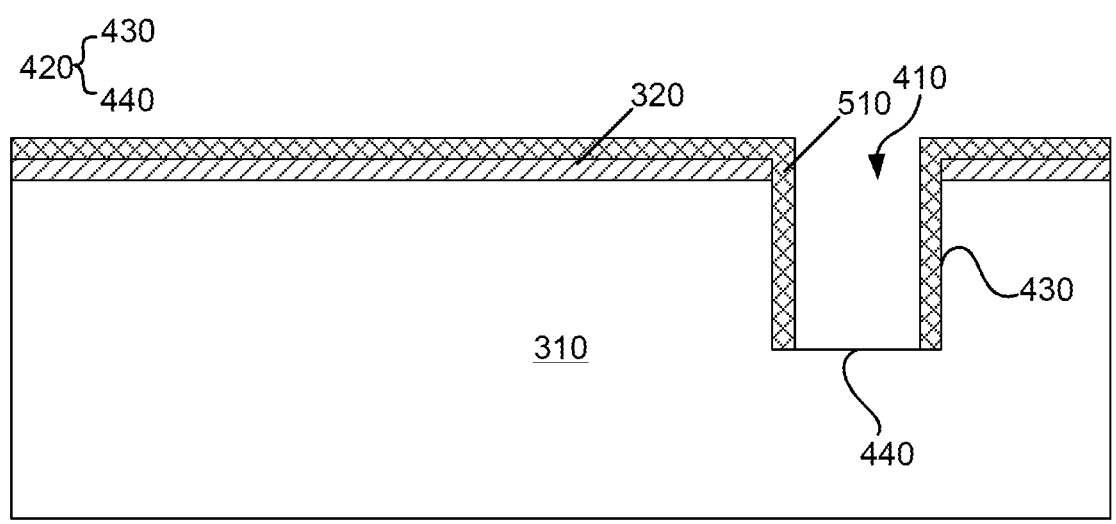

FIG. 6 is a schematic sectional view of another stage in the manufacturing of the LED cell 110 according to some embodiments of the present disclosure. FIG. 6 illustrates a structure after the blocking layer 510 on the bottom surface 440 of the hole-defining wall 420 is removed, exposing the bottom surface 440 of the hole-defining wall 420. In some embodiments, the blocking layer 510 on the bottom surface 440 of the hole-defining wall 420 may be removed using an inductively coupled plasma (ICP) etching process, an RIE process, any suitable dry etching process, or a combination thereof. In other embodiments, the blocking layer 510 on the bottom surface 440 of the hole-defining wall 420 is removed by a wet etching process or a combination of wet and dry etching processes.

Figure 7:
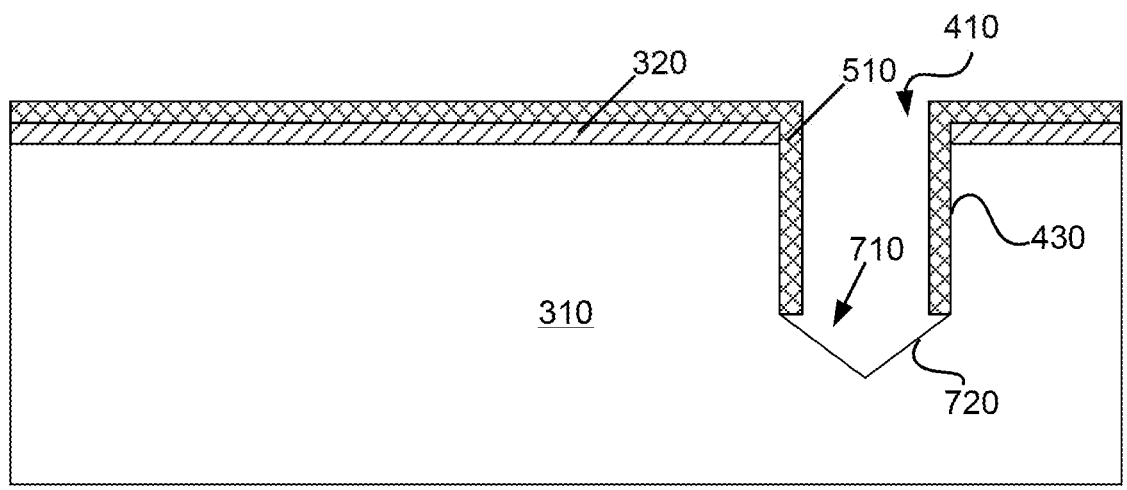

FIG. 7 is a schematic sectional view of another stage in the manufacturing of the LED cell 110 according to some embodiments of the present disclosure. FIG. 7 illustrates a structure after a groove 710 is formed in the substrate 310. The groove 710 is formed by etching the bottom surface 440 of the hole-defining wall 420 using the blocking layer 510 on the wall surface 430 of the hole-defining wall 420 as a mask. In some embodiments, the bottom surface 440 of the hole-defining wall 420 is etched using a wet etching process. In such some embodiments, the wet etching process is performed using an etching solution, e.g., KOH, heated to from about 70° C. to about 90° C., e.g., 80° C., substrate 310 for about 100 seconds to about 120 seconds, e.g., about 110 seconds. In other embodiments, the bottom surface 440 of the hole-defining wall 420 may be etched using a dry etching process or a combination of wet and dry etching processes.

As shown in FIG. 7, the groove 710 has a substantially triangular cross-section and is defined by a groove-defining wall 720. The groove-defining wall 720 tapers toward a bottom surface of the substrate 310 and includes opposite inclined surfaces, each of which has a (111) facet.

Figure 8:
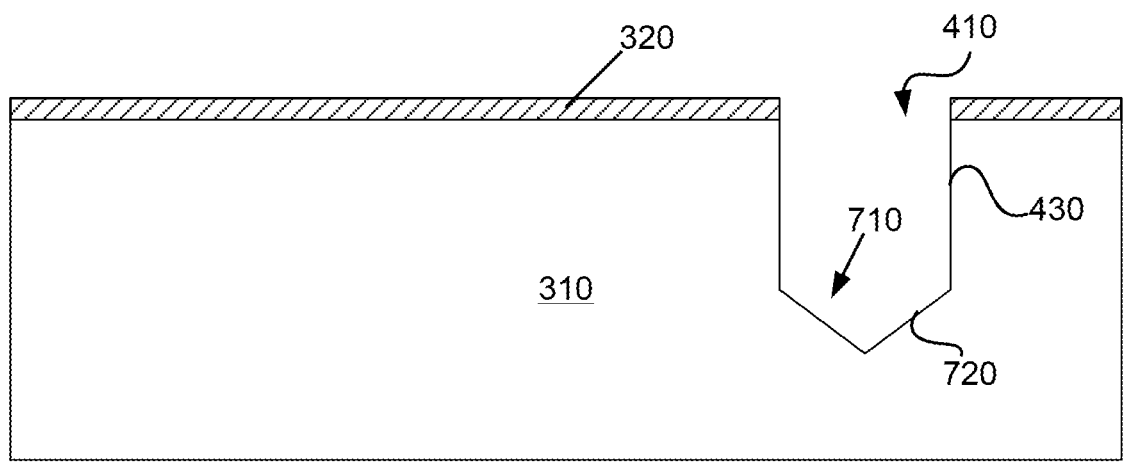

FIG. 8 is a schematic sectional view of another stage in the manufacturing of the LED cell 110 according to some embodiments of the present disclosure. FIG. 8 illustrates a structure after the blocking layers 510 on the top surface of the substrate 310 and the wall surface 430 are removed, using an ICP etching process, an RIE process, any suitable dry etching process, or a combination thereof. In an alternative embodiment, the blocking layers 510 on the top surface of the substrate 310 and the wall surface 430 are removed by a wet etching process or a combination of wet and dry etching processes.

Figure 9:
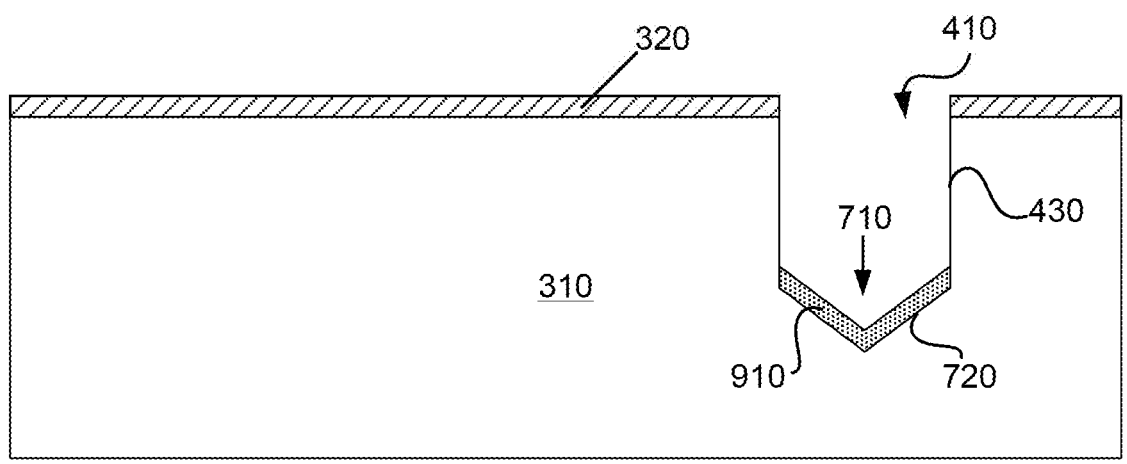

FIG. 9 is a schematic sectional view of another stage in the manufacturing of the LED cell 110 according to some embodiments of the present disclosure. FIG. 9 illustrates a structure after a buffer layer 910 is formed on the groove-defining wall 720. The buffer layer 910 may have a thickness of about 100 nm to about 500 nm, e.g., about 200 nm. Examples of materials for the buffer layer 910 include, but are not limited to, AlN, TiN, TaN, Hf nitride, and ZrN. The buffer layer 910 may be formed using CVD, PVD, ALD, their variations, such as metal organic CVD (MOCVD), any suitable deposition technique, or a combination thereof.

Figure 10:
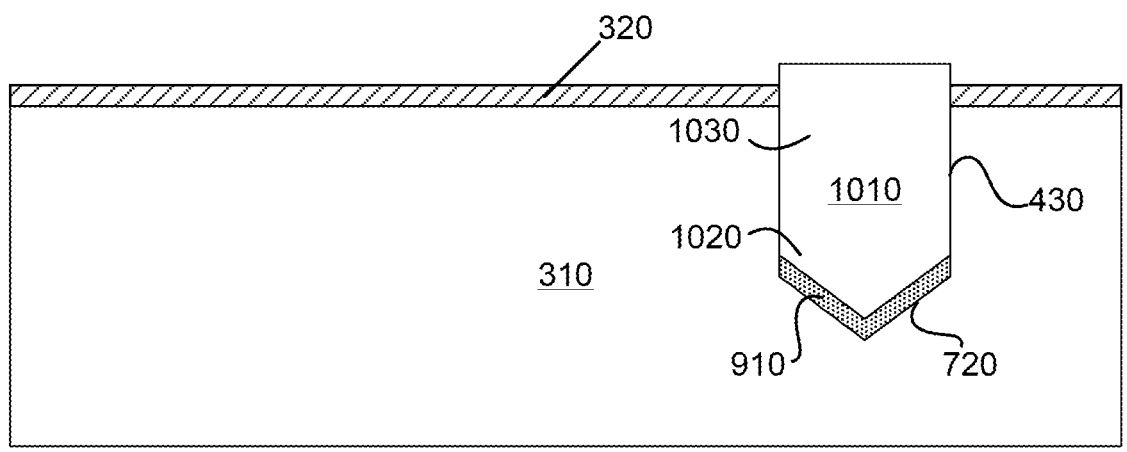

FIG. 10 is a schematic sectional view of another stage in the manufacturing of the LED cell 110 according to some embodiments of the present disclosure. FIG. 10 illustrates a structure after a first LED layer 1010 of an LED, e.g., LED 140, of the LED cell 110 is formed over the substrate 310. In this exemplary embodiment, the formation of the first LED layer 1010 includes: growing a III-V compound semiconductor on the buffer layer 910; implanting the III-V compound semiconductor with n-type impurities; and doping the III-V compound semiconductor with dopants, e.g., silicon.

The first LED layer 1010 is grown such that the III-V compound semiconductor, e.g., GaN, transitions from a hexagonal III-V compound semiconductor, e.g., h-GaN, i.e., at a lower portion 1020 of the first LED layer 1010, to a cubic III-V compound semiconductor, e.g., c-GaN, i.e., at an upper portion 1030 of the first LED layer 1010. The upper portion 1030 of the first LED layer 1010, i.e., the cubic III-V compound semiconductor, includes a top surface that has a facet, e.g. (100), the same as the facet of the top surface of the substrate 310.

Although the III-V compound semiconductor of the first LED layer 1010 is exemplified as GaN, the III-V compound semiconductor of the first LED layer 1010 may include InP, InAs, GaAs, InSb, or any suitable alloy of two or more III-V compound semiconductor.

Figure 11:
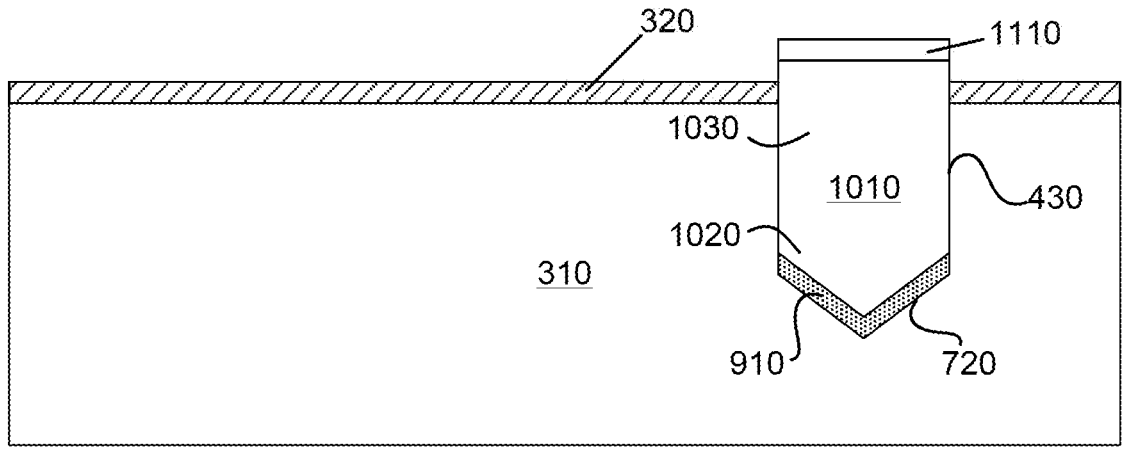

FIG. 11 is a schematic sectional view of another stage in the manufacturing of the LED cell 110 according to some embodiments of the present disclosure. FIG. 11 illustrates a structure after a light-generating layer 1110 of the LED 140 is formed on the top surface of the first LED layer 1010. In some embodiments, the light-generating layer 1110 includes a single quantum well (SQW). In other embodiments, the light-generating layer 1110 includes a multiple quantum well (MQW). In such other embodiments, the light-generating layer 1110 may include a plurality of alternating well layers, e.g., GaN, and barrier layers, e.g., AlGaN. The light-generating layer 1110 may be grown on the first LED layer 1010 using CVD, PVD, ALD, their variations, such as MOCVD, any suitable deposition technique, or a combination thereof.

Figure 12:
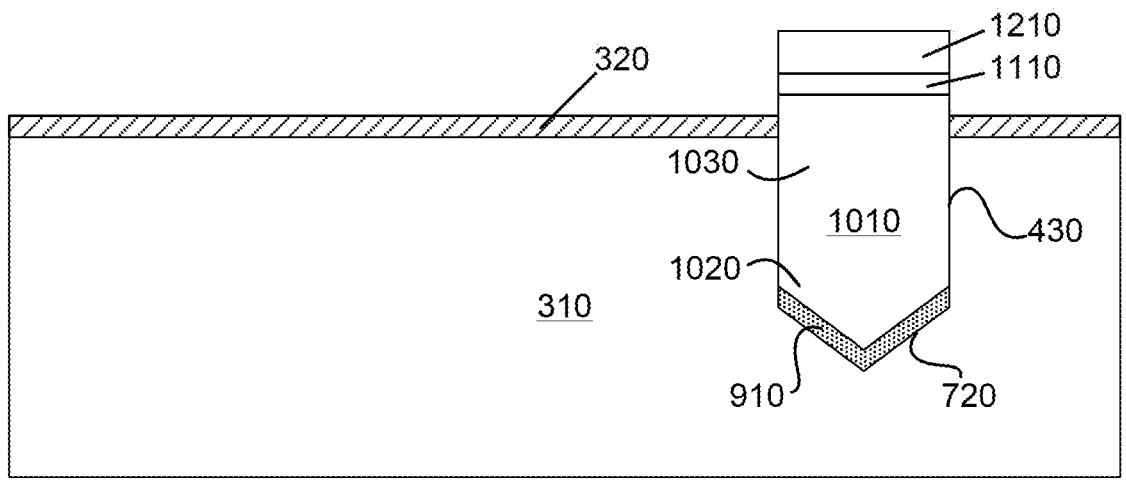

FIG. 12 is a schematic sectional view of another stage in the manufacturing of the LED cell 110 according to some embodiments of the present disclosure. FIG. 12 illustrates a structure after a second LED layer 1210 of the LED 140 is formed on a top surface of the light-generating layer 1110. In this exemplary embodiment, the formation of the second LED layer 1210 includes growing a III-V compound semiconductor, e.g., GaN, on the light-generating layer 1110 and implanting the III-V compound semiconductor with p-type impurities. In some embodiments, the second LED layer 1210 includes GaN. In other embodiments, the second LED layer 1210 includes InP, InAs, GaAs, InSb, or any suitable alloy of two or more III-V compound semiconductor. The second LED layer 1210 may have a thickness of about 100 nm to about 500 nm, e.g., about 150 nm.

Figure 13:
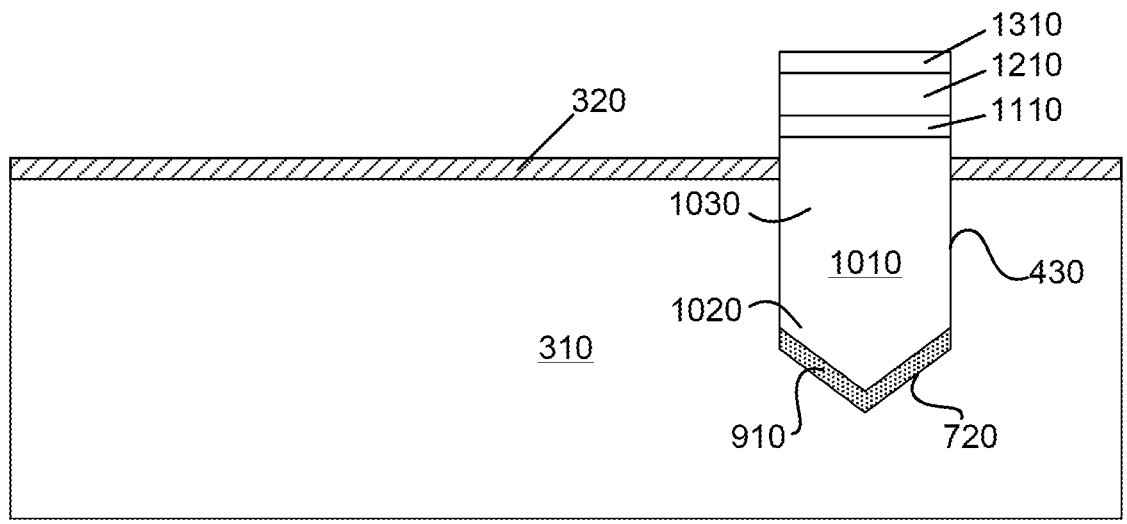

FIG. 13 is a schematic sectional view of another stage in the manufacturing of the LED cell 110 according to some embodiments of the present disclosure. FIG. 13 illustrates a structure after a current spreading layer 1310 is formed on a top surface of the second LED layer 1210. In this exemplary embodiment, the formation of the current spreading layer 1310 includes: depositing a photoresist layer over the substrate 310 and the second LED layer 1210; patterning the photoresist layer to expose the top surface of the second LED layer 1210; depositing a transparent conductive layer (TCL) on the top surface of the second LED layer 1210 exposed by the photoresist layer; and removing the photoresist layer. Examples of materials for the TCL include, but are not limited to, Ni, Au, Ag, Pt, and Pd, metal oxides such as InZnO (IZO), InO, ZnO, InSnO (ITO), SnO, SbSnO (ATO), SbO, SbZnO (AZO), CdSnO (CTO), and CdO, and metal nitrides such as TiN, WN, and TiWN. The current spreading layer 1310 may have a thickness of about 10 nm to about 100 nm.

Figure 14:
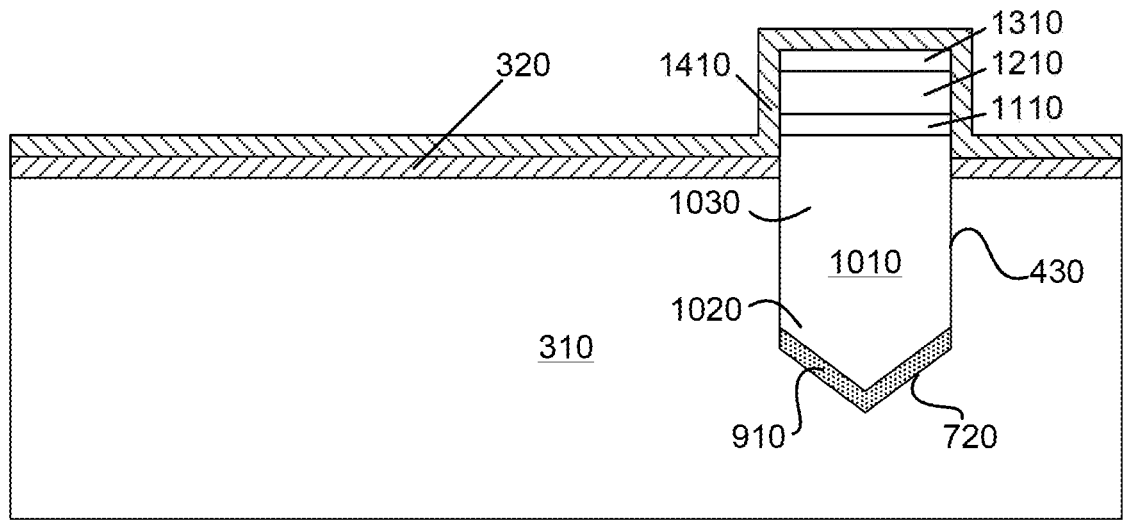

FIG. 14 is a schematic sectional view of another stage in the manufacturing of the LED cell 110 according to some embodiments of the present disclosure. FIG. 14 illustrates a structure after a protection layer 1410 is formed on a top surface of the dielectric layer 320 and a top surface of the current spreading layer 1310. Examples of materials for the protection layer 1410 include, but are not limited to, $SiO_2$, SiN, SiON, SiCN, and SiOCN. As will be apparent hereinbelow, the protection layer 1410 is configured to prevent damage to the LED 140 of the LED cell 110 during subsequent processes of forming a transistor, e.g., transistor 150, of the LED cell 110.

Figure 15:
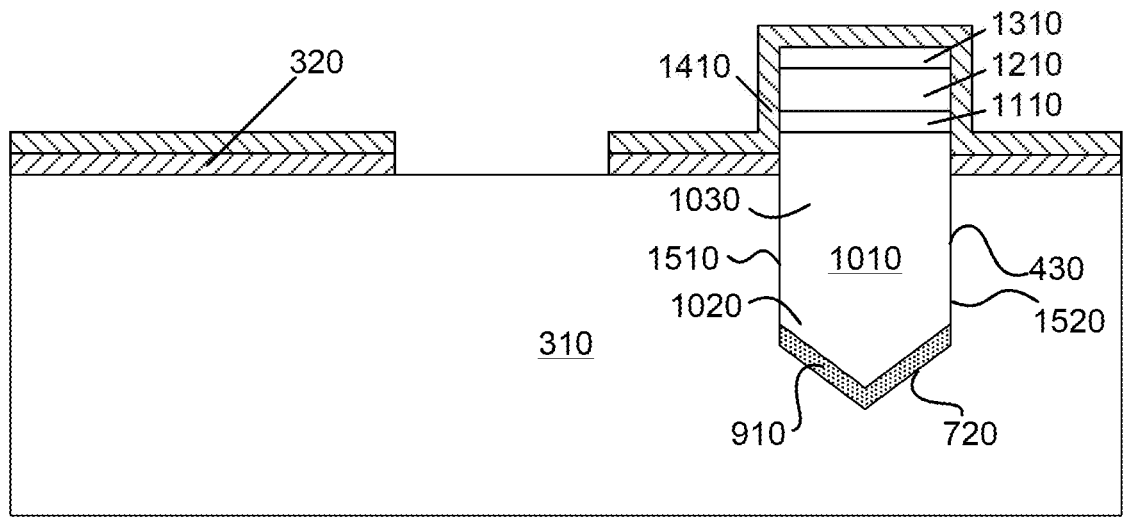

FIG. 15 is a schematic sectional view of another stage in the manufacturing of the LED cell 110 according to some embodiments of the present disclosure. FIG. 15 illustrates a structure after the protection layer 1410 and the dielectric layer 320 that are on the top surface of the substrate 310 adjacent a first sidewall 1510 of the first LED layer 1010 are removed, such as by a wet or dry etching process or a combination thereof. As shown in FIG. 15, remaining dielectric layers 320 are on the top surface of the substrate 310 adjacent the first sidewall 1510 of the first LED layer 1010 and the top surface of the substrate 310 adjacent a second sidewall 1520 of the first LED layer 1010 opposite the first sidewall 1510 of the first LED layer 1010. Further, remaining protection layers 1410 are on the top surface of the substrate 310 adjacent the first sidewall 1510 of the first LED layer 1010, the top surface of the substrate 310 adjacent the second sidewall 1520 of the first LED layer 1010, and the top surface of the current spreading layer 1310.

Figure 16:
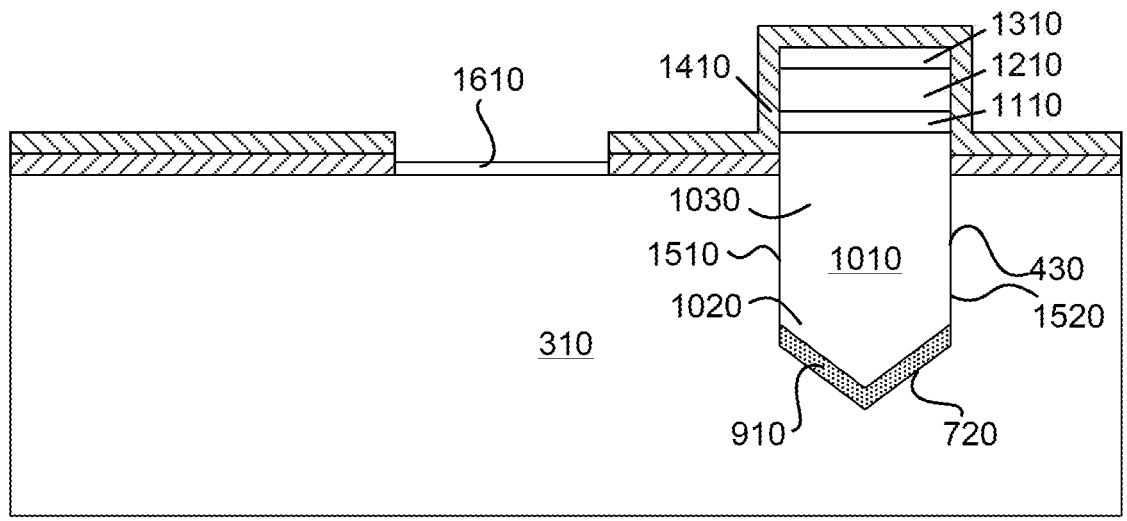

FIG. 16 is a schematic sectional view of another stage in the manufacturing of the LED cell 110 according to some embodiments of the present disclosure. FIG. 16 illustrates a structure after a gate dielectric 1610 of the transistor 150 is formed on the top surface of the substrate 310 exposed by the layers 320, 1410. The gate dielectric 1610 may include a dielectric material that has a dielectric constant from about 4, e.g., $SiO_2$, to about 8, e.g., SiN. Alternatively, the gate dielectric 1610 may include a higher dielectric constant dielectric material having a dielectric constant greater than about 8. Such higher dielectric constant dielectric materials may include, but are not limited to, HfO, HfSiO, HfZrO, TaO, ZrO, ZrSiO. LaO, AlO, TiO, YO, SrTO (STO), BaTiO (BTO), BaSnTn (BST), BaZrO, HfZrO, HfLaO, LaSiO, AlSiO, HfTaO, HfTiO, and PbZrTn (PZT).

Figure 17:
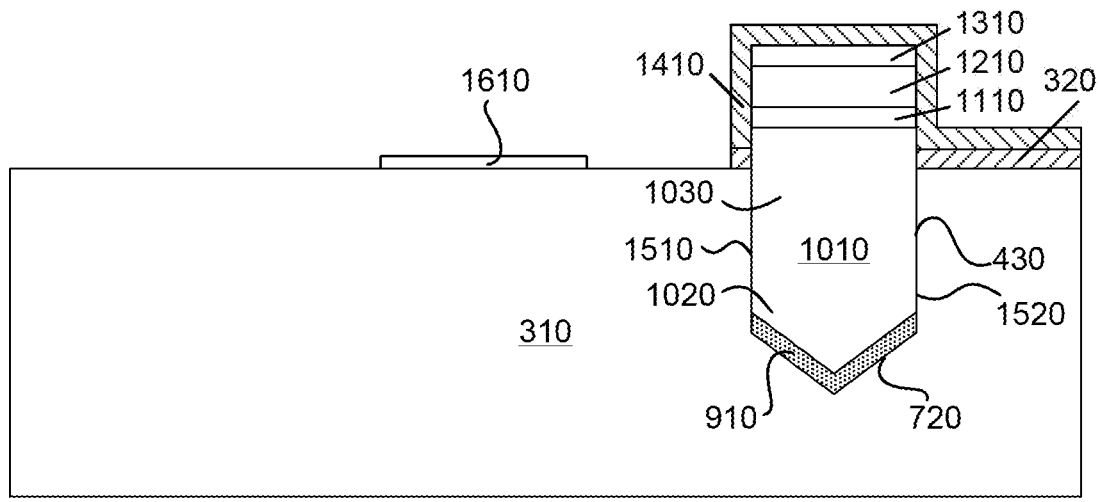

FIG. 17 is a schematic sectional view of another stage in the manufacturing of the LED cell 110 according to some embodiments of the present disclosure. FIG. 17 illustrates a structure after the dielectric layer 320 and the protection layers 1410 that are on the top surface of the substrate 310 adjacent the first sidewall 1510 of the first LED layer 1010 are removed, such as by a wet or dry etching process or a combination thereof. As shown in FIG. 15, a remaining dielectric layer 320 is on the top surface of the substrate 310 adjacent the second sidewall 1520 of the first LED layer 1010. Further, remaining protection layers 1410 are on the top surface of the substrate 310 adjacent the second sidewall 1520 of the first LED layer 1010 and the top surface of the current spreading layer 1310.

Figure 18:
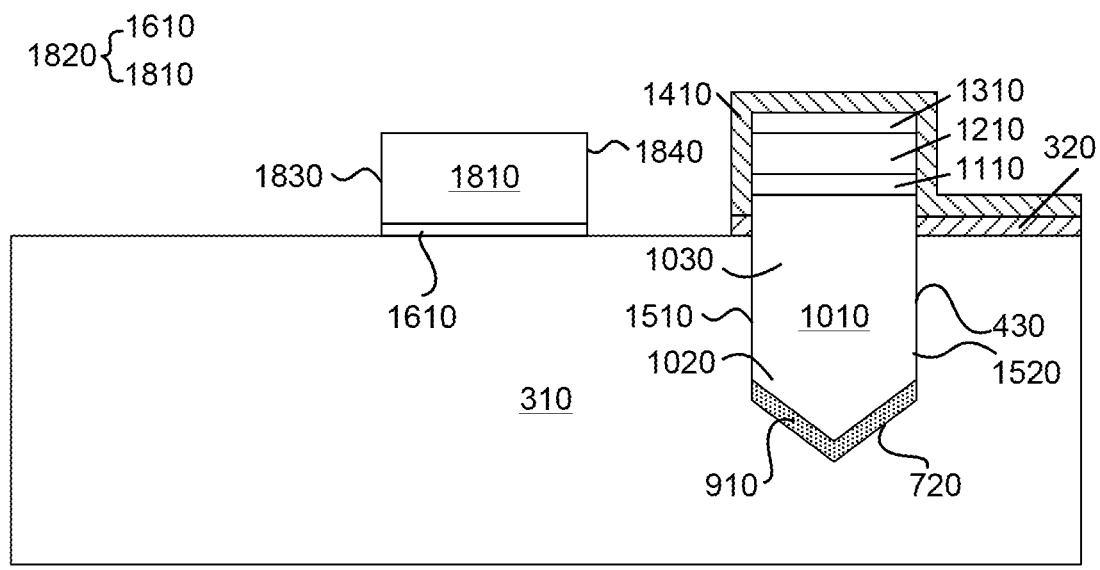

FIG. 18 is a schematic sectional view of another stage in the manufacturing of the LED cell 110 according to some embodiments of the present disclosure. FIG. 18 illustrates a structure after a gate electrode 1810 is formed on a top surface of the gate dielectric 1610. The gate electrode 1810 may be formed by depositing a gate material using CVD, PVD, ALD, their variations, any suitable deposition technique, or a combination thereof, on the gate dielectric 1610 and then by planarizing the deposited gate material using a chemical mechanical planarizing (CMP) technique. In some embodiments, the gate electrode 1810 includes polysilicon. In other embodiments, the gate electrode 1810 includes a metal layer. Examples of materials for the gate electrode 1810 include, but are not limited to, Ti, TiN, TiAl, Al, AlN, Ta, TaN, TaC, TaCN, TaSiN, and TaSi.

In certain embodiments, the gate electrode 1810 includes a metal layer and a work function metal layer, e.g., liner layer, wetting layer, adhesion layer, metal alloy, and metal silicide. The gate dielectric 1610 and the gate electrode 1810 constitute a gate structure 1820. As shown in FIG. 18, the gate structure 1820 has opposite first and second sidewalls 1830, 1840. In some embodiments, a distance between the second sidewall 1840 of the gate structure 1820 and the first sidewall 1510 of the first LED layer 1010 may be less than 50 nm, e.g., 30 nm. In other embodiments, a distance between the second sidewall 1840 of the gate structure 1820 and the first sidewall 1510 of the first LED layer 1010 may be less than 20 nm, e.g., 10 nm.

Figure 19:
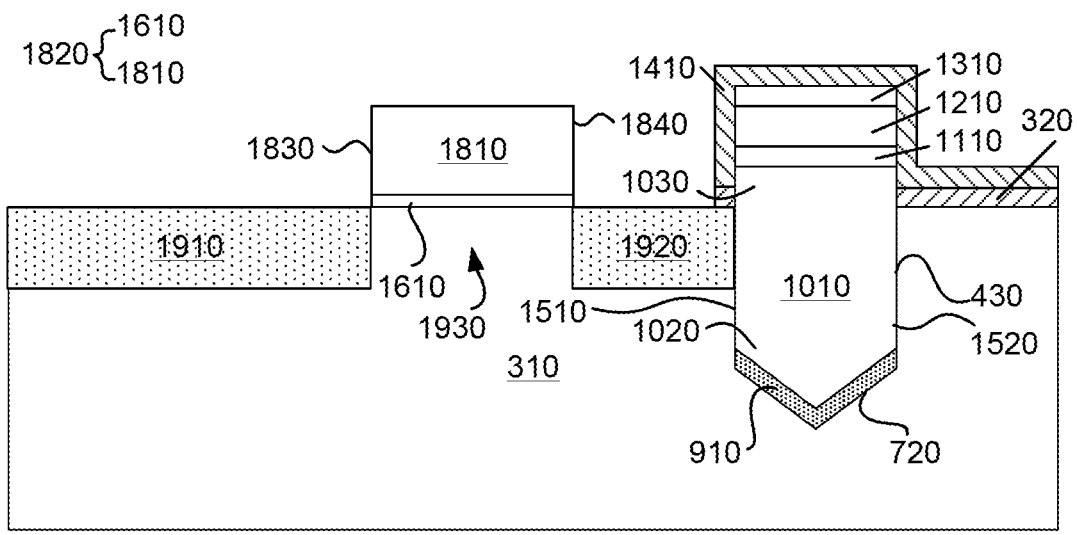

FIG. 19 is a schematic sectional view of another stage in the manufacturing of the LED cell 110 according to some embodiments of the present disclosure. FIG. 19 illustrates a structure after source and drain regions 1910, 1920 are formed adjacent the first and second sidewalls 1830, 1840 of the gate structure 1820, respectively. In this exemplary embodiment, the source and drain regions 1910, 1920 are formed by implanting n-type dopants in the substrate 310 using the gate structure 1820 as a mask, whereby a p-type channel 1930 is formed therebetween. Examples of materials for the n-type dopants include, but are not limited to, P, As, and Sb.

Although the source and drain regions 1910, 1920 are exemplified as implanted source and drain regions, in an alternative embodiment, the source and drain regions may be raised source and drain regions. In such an alternative embodiment, the formation of the raised source and drain regions includes: etching the substrate 310 to form a trench therein; growing epitaxial layer in the trench in the substrate 310 using CVD, PVD, ALD, their variations, e.g., MOCVD, any suitable deposition technique, or a combination thereof; and doping the epitaxial layer with n-type impurities. Each of the source and drain regions 1910, 1920 may include Si, SiC, SiCP, and the like.

Figure 20:
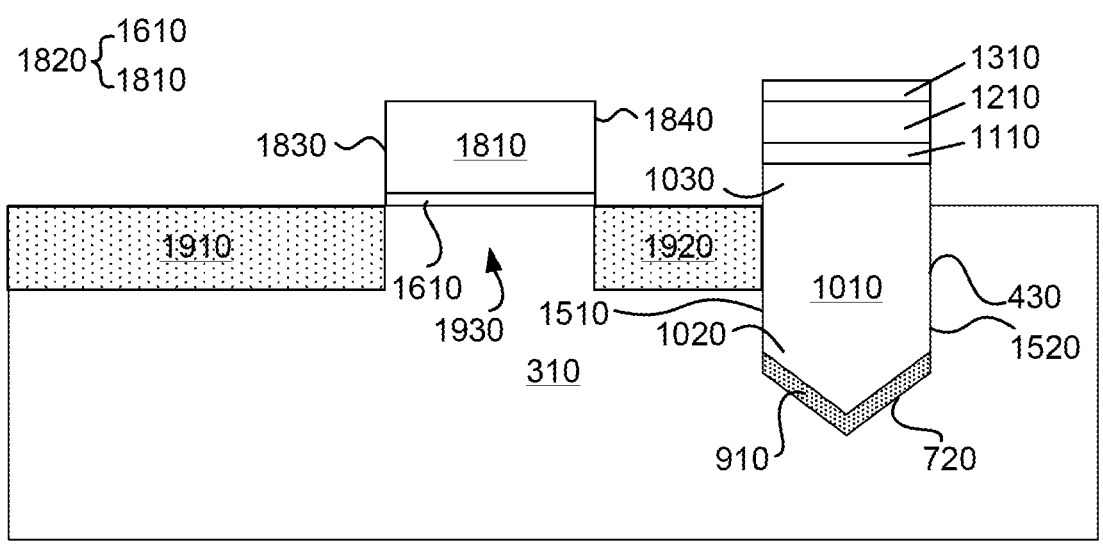

FIG. 20 is a schematic sectional view of another stage in the manufacturing of the LED cell 110 according to some embodiments of the present disclosure. FIG. 20 illustrates a structure after the dielectric layer 320 on the top surface of the substrate 310 adjacent the second sidewall 1520 of the first LED layer 1010 and the protection layers 1410 on the top surface of the substrate 310 adjacent the second sidewall 1520 of the first LED layer 1010 and the top surface of the current spreading layer 1310 are removed therefrom. The current spreading layer 1310 may be removed by a wet or dry etching process or a combination thereof.

Figure 21:
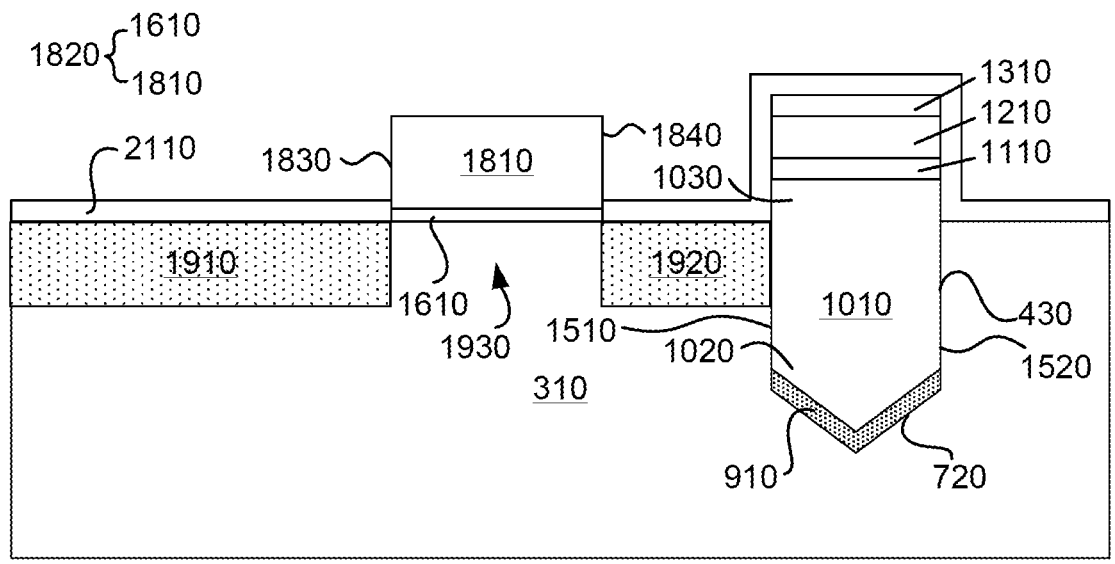

FIG. 21 is a schematic sectional view of another stage in the manufacturing of the LED cell 110 according to some embodiments of the present disclosure. FIG. 21 illustrates a structure after a passivation layer 2110 is formed on the top surfaces of the substrate 310 adjacent the first and second sidewalls 1510, 1520 of the first LED layer 1010 and the top surface of the current spreading layer 1310. Examples of materials for the passivation layer 2110 include, but are not limited to, $SiO_2$, SiN, SiON, SiCN, and SiOCN. The passivation layer 2110 may be formed using CVD, PVD, ALD, their variations, e.g., PECVD, any suitable deposition technique, or a combination thereof.

Figure 22:
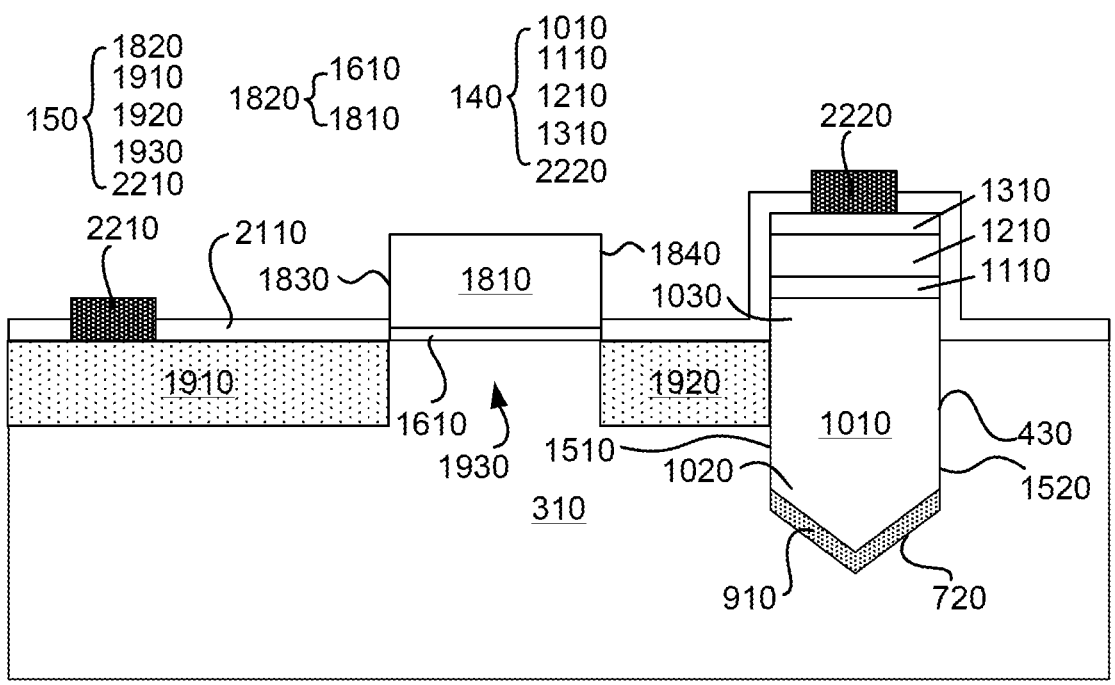

FIG. 22 is a schematic sectional view of another stage in the manufacturing of the LED cell 110 according to some embodiments of the present disclosure. FIG. 22 illustrates a structure after a source electrode 2210 and an LED electrode 2220 are formed in the structure of FIG. 21. As shown in FIG. 22, the source electrode 2210 extends to the source region 1910 through the passivation layer 2110. The LED electrode 2220 extends to the current spreading layer 1310 through the passivation layer 2110. The first and second LED layers 1010, 1210, the light-generating layer 1110, the current spreading layer 1310, and the LED electrode 2220 constitute the LED 140. The gate structure 1820, the source and drain regions 1910, 1920, the channel 1930, and the source electrode 2210 constitute the transistor 150.

In this exemplary embodiment, the formation of the electrodes 2210, 2220 are performed at the same time. Examples of materials for the electrodes 2210, 2220 include, but are not limited to, Al, Ag, Cu, Au, Cr, Ti, any suitable metal, or an alloy thereof. In some embodiments, the electrodes 2210, 2220 are formed using CVD, PVD, ALD, their variations, any suitable deposition technique, or a combination thereof. In an alternative embodiment, the LED electrode 2220 extends to the second LED layer 1210 through the passivation layer 2110 and the current spreading layer 1310.

As illustrated in FIG. 22, the thus formed LED cell 110 includes a substrate 310, a buffer layer 910, an LED 140, a transistor 150, and a passivation layer 2110. The substrate 310 may be a semiconductor substrate, such as a bulk semiconductor substrate, a semiconductor-on-insulator (SOI) substrate, a multi-layered or gradient substrate, or the like. The substrate 310 may include a semiconductor material, such as an elemental semiconductor including Si, Ge, a compound or alloy semiconductor including SiGe, SiC, GaAs, GaP, GaAsP, AlInAs, AlGaAs, GaInAs, InAs, GaInP, InP, InSb, GaInAsP, and the like. The substrate 310 may be doped or undoped. In this exemplary embodiment, the substrate 310 is a bulk silicon substrate and includes a top surface that has a (100) facet.

The buffer layer 910 is formed in the substrate 310. The buffer layer 910 may have a thickness of about 100 nm to about 500 nm, e.g., about 200 nm. Examples of materials for the buffer layer 910 include, but are not limited to, AlN, GaN, TiN, TaN, Hf nitride, and ZrN. The buffer layer 910 may be formed using CVD, PVD, ALD, their variations, such as MOCVD, any suitable deposition technique, or a combination thereof.

The LED 140 includes first and second LED layers 1010, 1210, a light-generating layer 1110, a current spreading layer 1310, and an LED electrode 2220. The first LED layer 1010 extends to the buffer layer 910 through the top surface of the substrate 310 and includes a lower portion 1020 and an upper portion 1030. The lower portion 1020 of the first LED layer 1010 has a substantially triangular cross-section, tapers toward a bottom surface of the substrate 310, and includes opposite inclined surfaces, each of which has a (111) facet. In this exemplary embodiment, the lower portion 1020 of the first LED layer 1010 is a hexagonal III-V compound semiconductor, e.g., h-GaN.

The upper portion 1030 of the first LED layer 1010 has a substantially rectangular cross-section and includes opposite first and second sidewalls 1510, 1520 substantially perpendicular to the top surface of the substrate 310. In this exemplary embodiment, upper portion 1030 of the first LED layer 1010 is a cubic III-V compound semiconductor, e.g., c-GaN, a top surface of which has a facet, e.g. (100), the same as the facet of the top surface of the substrate 310.

Although each of the lower and upper portions 1020, 1030 of the first LED layer 1010 is exemplified as GaN, each of the lower and upper portions 1020, 1030 of the first LED layer 1010 may include InP, InAs, GaAs, InSb, or any suitable alloy of two or more III-V compound semiconductor.

The light-generating layer 1110 is between the first and second LED layers 1010, 1210. In some embodiments, the light-generating layer 1110 covers opposite end portions of the top surface of the first LED layer 1010. In other embodiments, the light-generating layer 1110 covers opposite end portions of the top surface of the first LED layer 1010 and an intermediate portion between the opposite end portions of the top surface of the first LED layer 1010. In such other embodiments, the light-generating layer 1110 may cover the entire top surface of the first LED layer 1010.

In an embodiment, the light-generating layer 1110 includes a single quantum well (SQW). In an alternative embodiment, the light-generating layer 1110 includes a multiple quantum well (MQW). In such an alternative embodiment, the light-generating layer 1110 may include a plurality of alternating well layers, e.g., GaN, and barrier layers, e.g., AlGaN.

The second LED layer 1210, in some embodiments, covers opposite end portions of the top surface of the first LED layer 1010. In other embodiments, the second LED layer 1210 covers opposite end portions of the top surface of the first LED layer 1010 and an intermediate portion between the opposite end portions of the top surface of the first LED layer 1010. In such other embodiments, the second LED layer 1210 may cover the entire top surface of the first LED layer 1010. In this exemplary embodiment, the second LED layer 1210 includes a III-V compound semiconductor. In some embodiments, the second LED layer 1210 include GaN. In other embodiments, the second LED layer 1210 includes InP, InAs, GaAs, InSb, or any suitable alloy of two or more III-V compound semiconductor. The second LED layer 1210 may have a thickness of about 100 nm to about 500 nm, e.g., about 150 nm.

The current spreading layer 1310, in some embodiments, covers opposite end portions of the top surface of the first LED layer 1010. In other embodiments, the current spreading layer 1310 covers opposite end portions of the top surface of the first LED layer 1010 and an intermediate portion between the opposite end portions of the top surface of the first LED layer 1010. In such other embodiments, the current spreading layer 1310 covers the entire top surface of the first LED layer 1010.

In this exemplary embodiment, the current spreading layer 1310 includes a TCL. Examples of materials for the TCL include, but are not limited to, Ni, Au, Ag, Pt, and Pd, metal oxides such as InZnO (IZO), InO, ZnO, InSnO (ITO), SnO, SbSnO (ATO), SbO, SbZnO (AZO), CdSnO (CTO), and CdO, and metal nitrides such as TiN, WN, and TiWN. The current spreading layer 1310 may have a thickness of about 10 nm to about 100 nm.

The LED electrode 2220 is formed on, i.e., connected to, a top surface of the current spreading layer 1310. Examples of materials for the LED electrode 2220 include, but are not limited to, Al, Ag, Cu, Au, Cr, Ti, any suitable metal, or an alloy thereof. In an alternative embodiment, the LED electrode 2220 extends to the top surface of the second LED layer 1210 through the current spreading layer 1310. In such an alternative embodiment, the LED electrode 2220 and the current spreading layer 1310 may cover the entire top surface of the first LED layer 1010.

As shown in FIG. 22, while an LED electrode, e.g., LED electrode 2220, is associated with or is connected to the second LED layer 1210, there is no LED electrode associated with or connected to the first LED layer 1010. That is, there is no LED electrode formed on a top surface of the first LED layer 1010 or on a bottom surface of the first LED layer 1010. In other words, the first LED layer 1010 is free of an LED electrode.

The transistor 150 includes a gate structure 1820, source and drain regions 1910, 1920, and a source electrode 2210. The gate structure 1820 includes a gate dielectric 1610 on the top surface of the substrate 310 and a gate electrode 1810 on a top surface of the gate dielectric 1610. The source and drain regions 1910, 1920 are adjacent opposite first and second sidewalls 1830, 1840 of the gate structure 1820, respectively. As shown in FIG. 22, the drain region 1920 is formed on or connected to a first sidewall 1510 of the first LED layer 1010.

It is noted that, while the drain region 1920 is connected to or present on the first sidewall 1510 of the first LED layer 1010, the drain region 1920 is absent from a second sidewall 1520 of the first LED layer 1010 opposite the first sidewall 1510 of the first LED layer 1010. In other words, the second sidewall 1520 of the first LED layer 1010 is free of the drain region 1920. That is to say, the drain region 1920 of the transistor 150 serves as an LED electrode of the first LED layer 1010 of the LED 140.

The source electrode 2210 is formed on, i.e., connected to, the source region 1910. Examples of materials for the source electrode 2210 include, but are not limited to, Al, Ag, Cu, Au, Cr, Ti, any suitable metal, or an alloy thereof. The passivation layer 2110 is formed on the top surface of the substrate 310, the drain region 1920, and the top surface of the LED 140, and surrounds the electrodes 2210, 2220. Examples of materials for the passivation layer 2110 include, but are not limited to, SiO$_2$, SiN, SiON, SiCN, and SiOCN. In this exemplary embodiment, the passivation layer 2110 covers the entire drain region 1920.

As shown in FIG. 22, while a source electrode, e.g., source electrode 2210, is associated with or is connected to the source region 1910, there is no drain electrode associated with or connected to the drain region 1920. That is, there is no drain electrode formed on a top surface of the drain region 1920. In other words, the drain region 1920 is free of a drain electrode.

Figure 23:
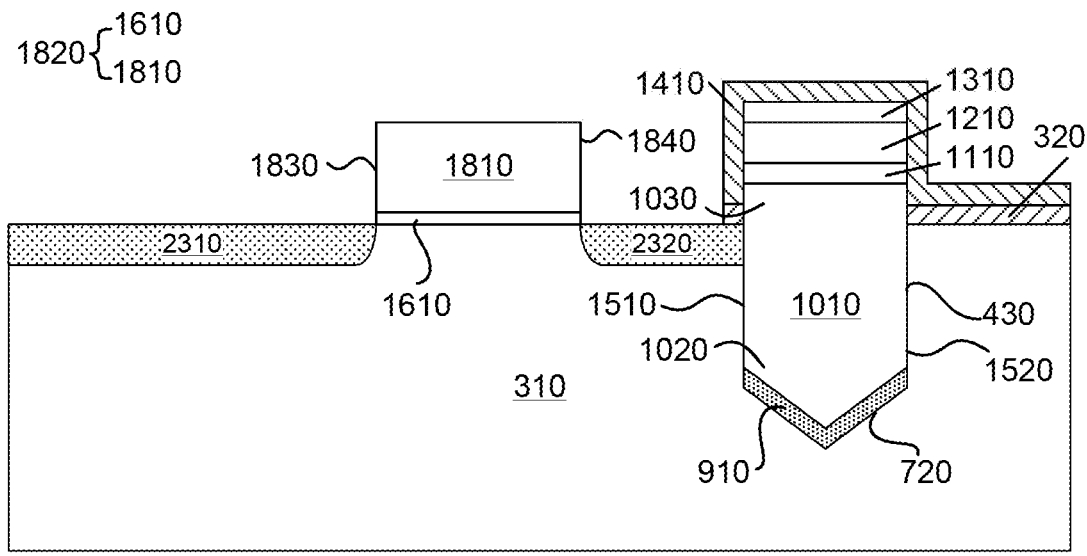

The transistor 150 as described herein may include additional features. For example, FIG. 23 is a schematic sectional view of another stage in the manufacturing of the LED cell 110 according to some embodiments of the present disclosure. FIG. 23 illustrates a structure after a pair of lightly doped source/drain regions 2310, 2320 are formed adjacent the first and second sidewalls 1830, 1840 of the gate structure 1820, respectively. In this exemplary embodiment, lightly doped source/drain regions 2310, 2320 are formed by implanting n-type dopants in the substrate 310 using the gate structure 1820 as a mask. Examples of materials for the n-type dopants include, but are not limited to, P, As, and Sb.

Figure 24:
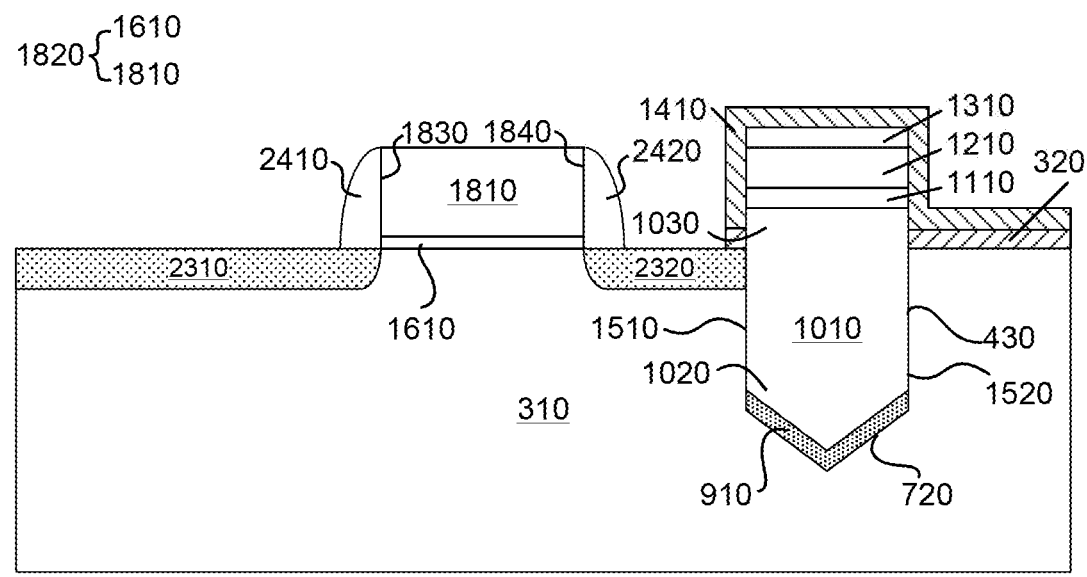

FIG. 24 is a schematic sectional view of another stage in the manufacturing of the LED cell 1010 according to some embodiments of the present disclosure. FIG. 24 illustrates a structure after a pair of gate spacers 2410, 2420 are formed on the first and second sidewalls 1830, 1840 of the gate structure 1820, respectively. Each of the gate spacers 2410, 2420 may include a plurality of spacer layers, such as main spacer layer, liner layers, and the like. In this exemplary embodiment, the gate spacers 2410, 2420 are formed by depositing a spacer material, such as $SiO_2$, SiN, SiC, SiON, or the like, on the gate structure 1820 and etching back the deposited spacer material using a wet or dry etching process or a combination thereof.

Figure 25:
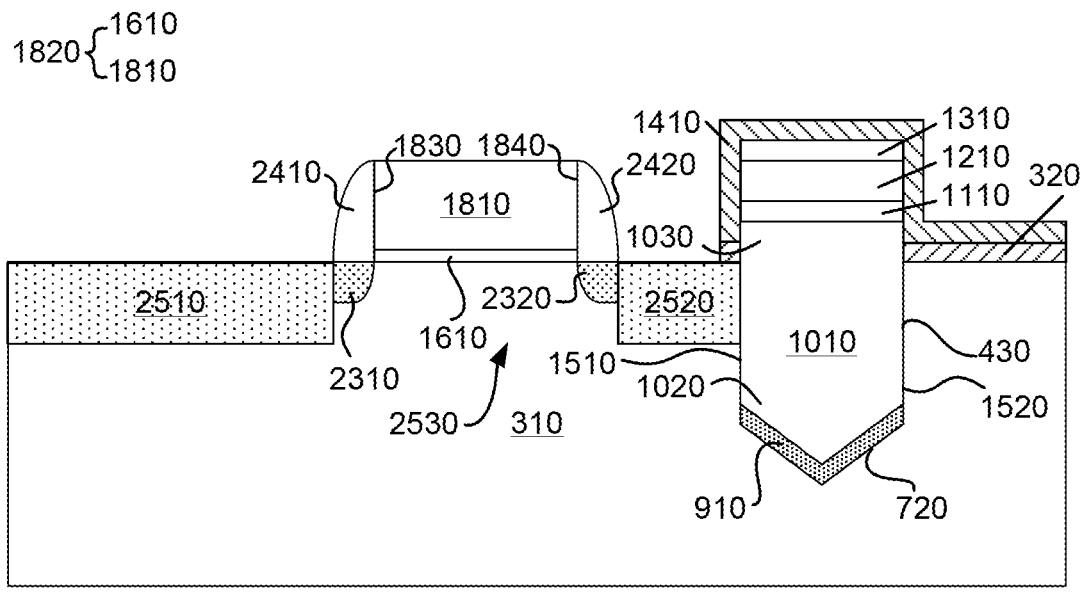

FIG. 25 is a schematic sectional view of another stage in the manufacturing of the LED cell 110 according to some embodiments of the present disclosure. FIG. 25 illustrates a structure after source and drain regions 2510, 2520 are formed adjacent the lightly doped source/drain regions 2310, 2320, respectively. In this exemplary embodiment, the source and drain regions 2510, 2520 are formed by implanting n-type dopants in the substrate 310 using the gate structure 1820 as a mask, whereby a p-type channel 2530 is formed therebetween. Examples of materials for the n-type dopants include, but are not limited to, P, As, and Sb.

Although the source and drain regions 2510, 2520 are exemplified as implanted source and drain regions, in an alternative embodiment, the source and drain regions may be raised source and drain regions. In such an alternative embodiment, the formation of the raised source and drain regions includes: etching the substrate 310 to form a trench therein; growing epitaxial layer in the trench in the substrate 310; and doping the epitaxial layer with n-type impurities. Each of the source and drain regions 1910, 1920 may include Si, SiC, SiCP, and the like.

Figure 26:
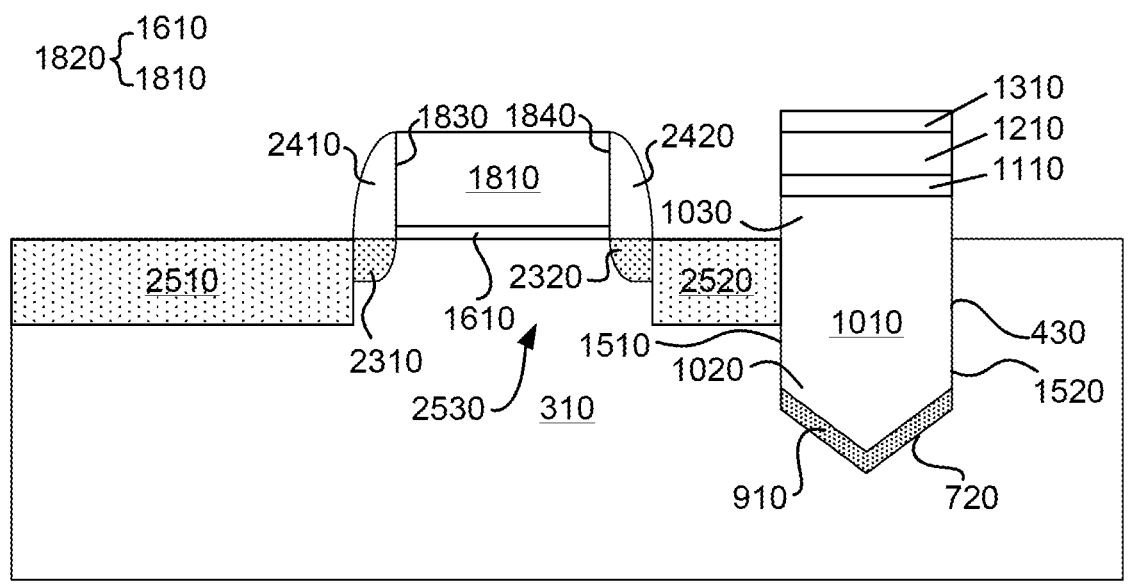

FIG. 26 is a schematic sectional view of another stage in the manufacturing of the LED cell 110 according to some embodiments of the present disclosure. FIG. 26 illustrates a structure after the dielectric layer 320 on the top surface of the substrate 310 adjacent the second sidewall 1520 of the first LED layer 1010 and the protection layers 1410 on the top surface of the substrate 310 adjacent the second sidewall 1520 of the first LED layer 1010 and the top surface of the current spreading layer 1310 are removed therefrom. The dielectric layer 320 on the top surface of the substrate 310 adjacent the second sidewall 1520 of the first LED layer 1010 and the protection layers 1410 on the top surface of the substrate 310 adjacent the second sidewall 1520 of the first LED layer 1010 and the top surface of the current spreading layer 1310 may be removed by a wet or dry etching process or a combination thereof.

Figure 27:
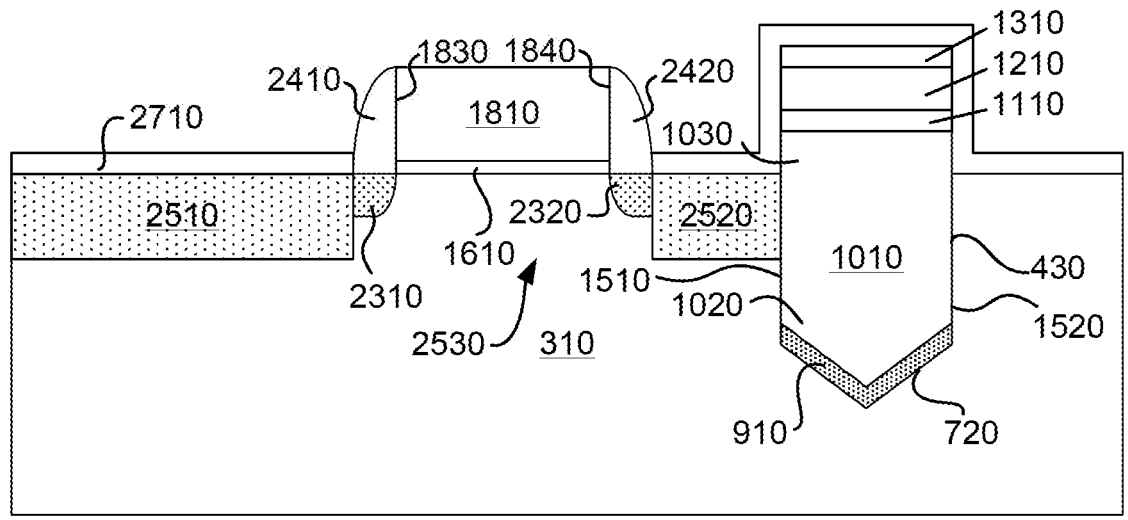

FIG. 27 is a schematic sectional view of another stage in the manufacturing of the LED cell 110 according to some embodiments of the present disclosure. FIG. 27 illustrates a structure after a passivation layer 2710 is formed on the top surfaces of the substrate 310 adjacent the first and second sidewalls 1510, 1520 of the first LED layer 1010 and the top surface of the current spreading layer 1310. Examples of materials for the passivation layer 2710 include, but are not limited to, $SiO_2$, SiN, SiON, SiCN, and SiOCN. The passivation layer 2710 may be formed using CVD, PVD, ALD, their variations, e.g., PECVD, any suitable deposition technique, or a combination thereof.

Figure 28:
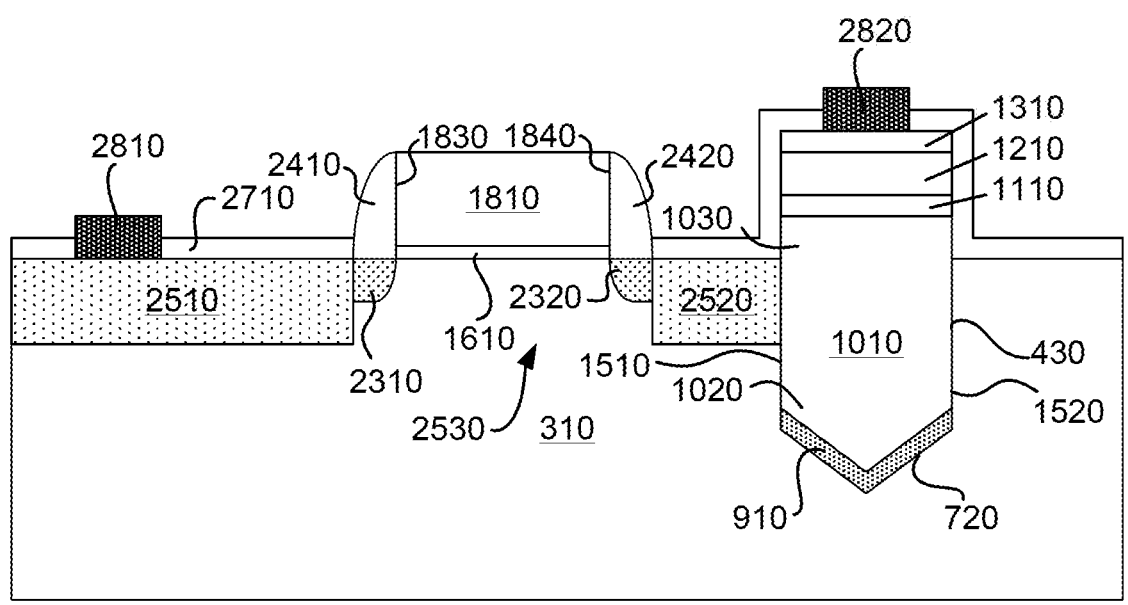

FIG. 28 is a schematic sectional view of another stage in the manufacturing of the LED cell 110 according to some embodiments of the present disclosure. FIG. 28 illustrates a structure after a source electrode 2810 and an LED electrode 2820 are formed in the structure of FIG. 27. As shown in FIG. 28, the source electrode 2810 extends to the source region 2510 through the passivation layer 2710. The LED electrode 2820 extends to the current spreading layer 1310 through the passivation layer 2710.

In this exemplary embodiment, the formation of the electrodes 2810, 2820 are performed at the same time. Examples of materials for the electrodes 2810, 2820 include, but are not limited to, Al, Ag, Cu, Au, Cr, Ti, any suitable metal, or an alloy thereof. In some embodiments, the electrodes 2810, 2820 are formed using CVD, PVD, ALD, their variations, any suitable deposition technique, or a combination thereof. In an alternative embodiment, the LED electrode 2820 extends to the second LED layer 1210 through the passivation layer 2710 and the current spreading layer 1310.

According to an exemplary embodiment of the present disclosure, a light-emitting diode (LED) assembly comprises a plurality of LED cells and a driving circuit. Each of the LED cells includes an LED and a transistor. The LED includes first and second LED layers and an LED electrode. The first LED layer includes a III-V compound semiconductor. The second LED layer is over the first LED layer. The LED electrode is over the second LED layer. The first LED layer is free of an LED electrode. The transistor includes a drain region connected to the first LED layer. The driving circuit is configured to drive the LED cells.

According to another exemplary embodiment of the present disclosure, a light-emitting diode (LED) assembly comprises a plurality of LED cells and a driving circuit. Each of the LED cells includes an LED and a transistor. The LED includes an LED layer that includes a III-V compound semiconductor and that has a first sidewall and a second sidewall opposite the first sidewall. The transistor includes a drain region connected to the first sidewall of the LED layer. The second sidewall of the LED layer is free of the drain region. The driving circuit is configured to drive the LED cells.

According to another exemplary embodiment of the present disclosure, a method of manufacturing a light-emitting diode (LED) cell comprises forming an LED of the LED cell over a substrate and after forming the LED, forming a transistor of the LED cell over the substrate. Forming the LED includes growing a III-V compound semiconductor on the substrate. The transistor includes a drain region connected to the LED.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A light-emitting diode (LED) assembly, comprising:
   a plurality of LED cells, each of which includes:
      an LED including
         a first LED layer including a III-V compound semiconductor, a second LED layer over the first LED layer, and
an LED electrode over the second LED layer, wherein the first LED layer is free of an LED electrode; and
a transistor including a drain region connected to the first LED layer;
a transparent contact layer between the second LED layer and the LED electrode and covering opposite end portions of a top surface of the first LED layer; and
a driving circuit configured to drive the plurality of LED cells.

2. The LED assembly of claim 1, wherein the second LED layer covers the opposite end portions of the top surface of the first LED layer.

3. The LED assembly of claim 2, wherein the second LED layer further covers an intermediate portion of the top surface of the first LED layer between the opposite end portions of the top surface of the first LED layer.

4. The LED assembly of claim 1, further comprising a light-generating layer between the first and second LED layers and covering the opposite end portions of the top surface of the first LED layer.

5. The LED assembly of claim 4, wherein the light-generating layer further covers an intermediate portion of the top surface of the first LED layer between the opposite end portions of the top surface of the first LED layer.

6. The LED assembly of claim 1, wherein the transparent contact layer further covers an intermediate portion of the top surface of the first LED layer between the opposite end portions of the top surface of the first LED layer.

7. The LED assembly of claim 1, wherein the drain region is free of a drain electrode.

8. A method of manufacturing a light-emitting diode (LED) cell, the method comprising:
forming an LED of the LED cell over a substrate, wherein forming the LED includes growing a III-V compound semiconductor on the substrate;
forming a protection layer on a top surface of the substrate and a top surface of the LED;
removing the protection layer to expose the top surface of the substrate;
forming a gate dielectric on the top surface of the substrate exposed by the protection layer;
forming a gate electrode on the gate dielectric; and
after forming the LED, forming a transistor of the LED cell over the substrate that includes a drain region connected to the LED.

9. The method of claim 8, further comprising, after forming the gate dielectric and prior to forming the gate electrode, removing the protection layer on the top surface of the substrate adjacent a first sidewall of the LED.

10. The method of claim 9, further comprising:
forming source and drain regions respectively adjacent opposite sidewalls of the transistor; and
after forming the source and drain regions, removing the protection layer on the top surface of the substrate adjacent a second sidewall of the LED opposite the first sidewall of the LED.

11. The method of claim 9, further comprising:
forming source and drain regions respectively adjacent opposite sidewalls of the transistor; and
after forming the source and drain regions, removing the protection layer on the top surface of the LED.

12. The method of claim 9, further comprising:
forming source and drain regions respectively adjacent opposite sidewalls of the transistor; and
after forming the source and drain regions, simultaneously removing the protection layer on the top surface of the substrate adjacent a second sidewall of the LED opposite the first sidewall of the LED and the protection layer on the top surface of the LED.

13. The method of claim 8, further comprising:
forming source and drain regions respectively adjacent opposite sidewalls of the transistor; and
after forming the source and drain regions, forming a passivation layer on the top surface of the substrate and the top surface of the LED.

14. The method of claim 13, further comprising:
removing the passivation layer on the top surface of the LED;
forming an LED electrode on the top surface of the LED electrode;
removing the passivation layer on the top surface of the substrate to expose the source region; and
forming a source electrode on the source region exposed by the passivation layer.

* * * * *